(12) United States Patent
Miyahara (10) Patent No.: US 10,972,066 B2
(45) Date of Patent: Apr. 6, 2021

(54) LAMINATED ELECTRONIC COMPONENT AND METHOD OF MANUFACTURING THE SAME

(71) Applicant: Murata Manufacturing Co., Ltd., Nagaokakyo (JP)

(72) Inventor: Kunihiro Miyahara, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/550,583

(22) Filed: Aug. 26, 2019

(65) Prior Publication Data

US 2019/0379343 A1    Dec. 12, 2019

Related U.S. Application Data

(63) Continuation of application No. PCT/JP2018/006664, filed on Feb. 23, 2018.

(30) Foreign Application Priority Data

Feb. 28, 2017   (JP) .............................. JP2017-037475

(51) Int. Cl.
    *H03H 1/00*    (2006.01)
    *H03H 7/01*    (2006.01)
    (Continued)

(52) U.S. Cl.
    CPC ........... *H03H 1/00* (2013.01); *H01F 27/2804* (2013.01); *H01F 27/29* (2013.01); *H01F 27/36* (2013.01); *H01F 27/40* (2013.01); *H01F 41/041* (2013.01); *H01G 4/232* (2013.01); *H01G 4/30* (2013.01); *H01G 4/40* (2013.01); *H03H 3/00* (2013.01); *H03H 7/0115* (2013.01); *H05K 9/0007* (2013.01); *H01F 2027/2809* (2013.01); *H01P 11/007* (2013.01); *H03H 2001/0085* (2013.01)

(58) Field of Classification Search
    CPC .......... H01P 11/007; H03H 2001/0085; H03H 7/0115; H03H 1/0007
    USPC ................................................. 333/175, 185
    See application file for complete search history.

(56) References Cited

U.S. PATENT DOCUMENTS 4,918,570 A    4/1990   Okamura et al.
5,488,765 A    2/1996   Kubota et al.
(Continued)

FOREIGN PATENT DOCUMENTS

JP    01-295407 A    11/1989
JP    06-96992 A     4/1994
(Continued)

OTHER PUBLICATIONS

Official Communication issued in International Patent Application No. PCT/JP2018/006664, dated May 29, 2018.

*Primary Examiner* — Rakesh B Patel
(74) *Attorney, Agent, or Firm* — Keating & Bennett, LLP (57) ABSTRACT

A laminated electronic component includes a multilayer body including multiple insulator layers that are laminated and including a bottom surface, a top surface, and multiple side surfaces. The laminated electronic component includes a shield film provided on at least one side surface of the multilayer body. In the laminated electronic component, at least one step difference is provided along a ridge at which the bottom surface and a corresponding one of the side surfaces of the multilayer body are connected to each other, and the shield film includes an edge portion disposed within the at least one step difference.

19 Claims, 9 Drawing Sheets

(51) Int. Cl.
   *H01F 27/28*   (2006.01)
   *H01F 27/29*   (2006.01)
   *H01F 27/36*   (2006.01)
   *H01F 27/40*   (2006.01)
   *H01F 41/04*   (2006.01)
   *H01G 4/232*   (2006.01)
   *H01G 4/30*    (2006.01)
   *H01G 4/40*    (2006.01)
   *H03H 3/00*    (2006.01)
   *H05K 9/00*    (2006.01)
   *H01P 11/00*   (2006.01)

(56) References Cited

U.S. PATENT DOCUMENTS

| | | |
|---|---|---|
| 6,304,164 B1 | 10/2001 | Ohno et al. |
| 2015/0364255 A1 | 12/2015 | Ming et al. |

FOREIGN PATENT DOCUMENTS

| | | |
|---|---|---|
| JP | 09-121093 A | 5/1997 |
| JP | 11-3836 A | 1/1999 |
| JP | 11-219837 A | 8/1999 |
| JP | 2002-305115 A | 10/2002 |

LAMINATED ELECTRONIC COMPONENT AND METHOD OF MANUFACTURING THE SAME

CROSS REFERENCE TO RELATED APPLICATIONS

This application claims the benefit of priority to Japanese Patent Application No. 2017-037475 filed on Feb. 28, 2017 and is a Continuation Application of PCT Application No. PCT/JP2018/006664 filed on Feb. 23, 2018. The entire contents of each application are hereby incorporated herein by reference.

BACKGROUND OF THE INVENTION

1. Field of the Invention

The present invention relates to a laminated electronic component in which a shield film is provided on a multilayer body, and more particularly, to a laminated electronic component from which the shield film does not peel off easily.

The present invention also relates to a method for manufacturing the laminated electronic component.

2. Description of the Related Art

In a laminated electronic component, a shield film may be formed on a surface of a multilayer body in order to inhibit outside noise from entering and also inhibit inside noise from leaking out.

A laminated electronic component including such a shield film is disclosed in Japanese Unexamined Patent Application Publication No. 9-121093. The laminated electronic component 1100 (a shield-type laminated electronic component) disclosed in Japanese Unexamined Patent Application Publication No. 9-121093 is illustrated in FIG. 9.

The laminated electronic component 1100 has a cuboid shape, and a shield film (GND electrode) 101 is formed on a predetermined portion of the surface thereof.

The laminated electronic component 1100 has a disadvantage in that the shield film 101 peels off easily from the surface thereof. For example, in a case in which many laminated electronic components 1100 are disposed in a parts feeder and agitated, the laminated electronic components 1100 collide with each other, which may cause the shield film 101 to peel off easily from the surface. The laminated electronic component 1100 from which the shield film 101 peels off cannot be used even if the shield film 101 is detached only partially. For one thing, the laminated electronic component 1100 has a defective appearance. For another, the laminated electronic component 1100 may have altered electric characteristics, and a detached portion may come into contact with other conductors and may cause a short circuit.

Figure 9:
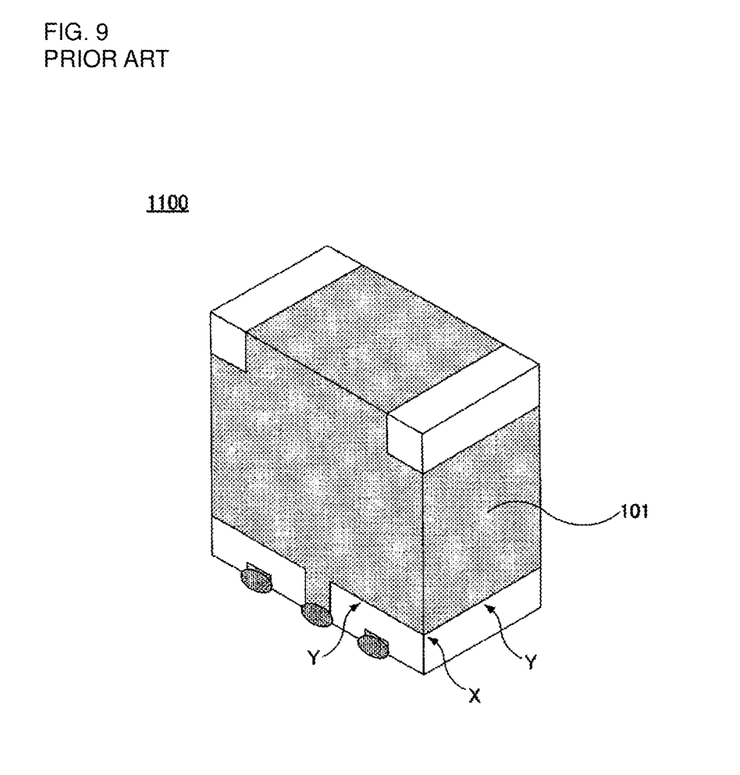
FIG. 9 is a perspective view illustrating a laminated electronic component 1100 disclosed in Japanese Unexamined Patent Application Publication No. 9-121093.

Detachment of the shield film 101 from a surface tends to start from edges of the shield film 101, which are indicated by reference X and reference Y in FIG. 9. An edge portion of the shield film 101 has weak adhesion. When an object (such as another laminated electronic component 1100) hits the edge portion, the shield film 101 may start to peel off easily. Note that detachment tends to occur especially from an edge of the shield film 101 located at a ridge portion of the laminated electronic component 1100, as indicated by reference X. This is because an object (such as another laminated electronic component 1100) tends to hit the ridge portion and the adhesion of the shield film 101 is especially weak at the ridge portion. Note that in FIG. 9, references X and Y are added to the figure for convenience of explanation.

SUMMARY OF THE INVENTION

Preferred embodiments of the present invention provide laminated electronic components that each include a multilayer body in which multiple insulator layers are laminated and that includes a bottom surface, a top surface, and multiple side surfaces that connect the bottom surface and the top surface to each other. The laminated electronic component also includes a shield film provided on at least one of the side surfaces of the multilayer body. In the laminated electronic component, at least one step difference is provided along a ridge at which the bottom surface and the at least one of the side surfaces of the multilayer body are connected to each other, and the shield film includes an edge portion disposed within the at least one step difference. In other words, in the laminated electronic component according to this preferred embodiment, the edge portion of the shield film from which detachment tends to start is disposed inside the at least one step difference and thus is protected so as not to cause other objects (such as other laminated electronic components) to hit the edge of the shield film easily.

For example, it is preferable that the multilayer body includes four side surfaces, and the shield film is provided on the four side surfaces. In addition, the step differences preferably have a rectangular or substantially rectangular and annular shape along four ridges at which respective four side surfaces and the bottom surface are connected. In this case, the shield film is able to reliably reduce or prevent noise from entering or from leaking out.

It is preferable that the shield film is provided over the entirety or substantially the entirety of the four side surfaces. In this case, the shield film is able to further reduce or prevent noise from entering or from leaking out.

Each step difference may, for example, include two surfaces with one surface parallel or substantially parallel to a corresponding one of the side surfaces and the other surface parallel or substantially parallel to the bottom surface. Alternatively, each step difference may have a stepwise shape. In these cases, the edges of the shield film are able to be reliably protected by the step differences.

It is preferable that the multilayer body includes rounded edges at which adjacent surfaces thereof are connected. In this case, when an object (such as another laminated electronic component) hits a ridge portion of the multilayer body, the ridge portion of the multilayer body 1 does not produce cracks or chipping easily. In addition, when the ridge portion of the multilayer body hits an object (such as another laminated electronic component), the impact on the object is small.

The shield film is preferably also provided on the top surface. In this case, the shield film is able to further reduce or prevent noise from entering or from leaking out.

The shield film is preferably provided over the entirety or substantially the entirety of the top surface. In this case, the shield film is able to even further reduce or prevent noise from entering or from leaking out.

The multilayer body may include an internal shield film disposed between insulator layers near the top surface. In this case, the internal shield film is able to reduce or prevent noise from entering or from leaking out.

A method of manufacturing a laminated electronic component according to a preferred embodiment of the present invention sequentially includes a step of providing an unsintered multilayer body that includes a bottom surface, a top surface, and multiple side surfaces that connect the bottom surface and the top surface to each other and in which multiple ceramic green sheets are laminated and resin paste is applied on the bottom surface along peripheral edges thereof. The method of manufacturing the laminated electronic component further includes, sequentially, a step of pushing the resin paste into the bottom surface, a step of firing the unsintered multilayer body and thus producing a multilayer body in which at least one step difference is formed along a ridge at which a corresponding one of the side surfaces and the bottom surface are connected, and a step of forming a shield film on the corresponding one of the side surfaces of the multilayer body, the shield film including an edge disposed within the at least one step difference.

It is preferable that the unsintered multilayer body includes four side surfaces, that the resin paste is applied on the bottom surface of the unsintered multilayer body rectangularly and annularly along peripheral edges thereof, and that the step differences is formed into a rectangular or substantially rectangular and annular shape along four ridges of the multilayer body at which the four side surfaces and the bottom surface are connected to each other. In this case, a laminated electronic component in which the shield film further reduces or prevents noise from entering or from leaking out is able to be manufactured.

It is preferable that a step of rounding portions of the unsintered multilayer body, by using barrel polishing, at which adjacent surfaces of the unsintered multilayer body are connected to each other is performed between the step of pushing the resin paste into the bottom surface and the step of firing the unsintered multilayer body and thus producing the multilayer body. In this case, the laminated electronic component in which a ridge portion of the multilayer body does not produce cracks or chipping easily when other objects (such as other laminated electronic components) hit the ridge portion is able to be manufactured. In addition, the laminated electronic component in which an impact on an object (such as another laminated electronic component) is small when the ridge portion of the multilayer body hits the object is able to be manufactured.

It is preferable that the resin paste applied on the bottom surface of the unsintered multilayer body along the peripheral edges thereof is a resin paste applied in advance on a bottom main surface of one of the ceramic green sheets that is laminated as a bottommost layer of the unsintered multilayer body along peripheral edges of the bottom main surface. In this case, the resin paste is able to be disposed easily along the peripheral edges of bottom surface of the unsintered multilayer body.

It is preferable that the shield film is formed using sputtering. In this case, a high quality shield film is able to be formed on the side surfaces of the multilayer body and also is able to be formed inside the step difference.

In laminated electronic components according to preferred embodiments of the present invention, the edges of the shield film from which detachment tends to start are disposed inside the step differences and are thus protected. Accordingly, other objects (for example, other laminated electronic components) do not hit the edges of the shield film easily, which makes it difficult for the shield film to peel off from the multilayer body.

The laminated electronic components according to preferred embodiments of the present invention are able to be manufactured easily by using the methods of manufacturing laminated electronic components according to preferred embodiments of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail with reference to the accompanying drawings.

The preferred embodiments described herein are examples, and the present invention is not limited thereto. In addition, configurations described in different preferred embodiments may be combined to each other, and resulting configurations are also within the scope of the present invention. The drawings are provided for the purpose of better understanding of the specification. Figures may be drawn schematically, and elements drawn therein and scaling of the elements may not reflect what are described in the specification. In addition, elements described in the specification may be omitted in the drawings, and the number of individual elements may be different from what is described in the specification.

First Preferred Embodiment

Figure 1A:
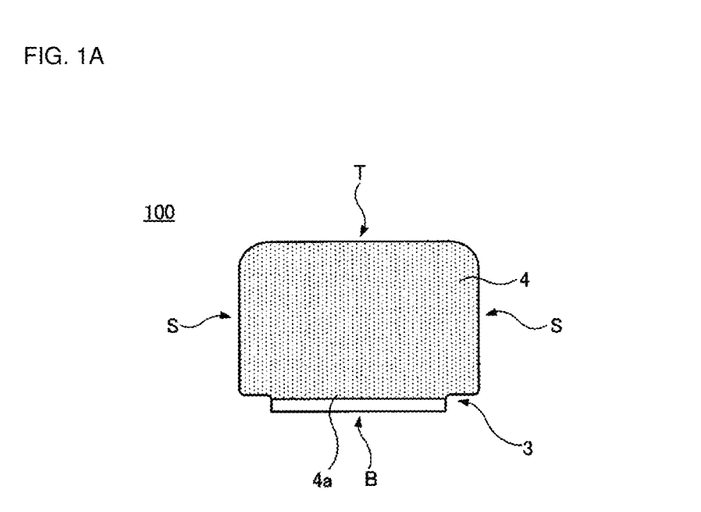
FIG. 1A is a front view illustrating a laminated electronic component 100 according to a first preferred embodiment of the present invention.
Figure 1B:
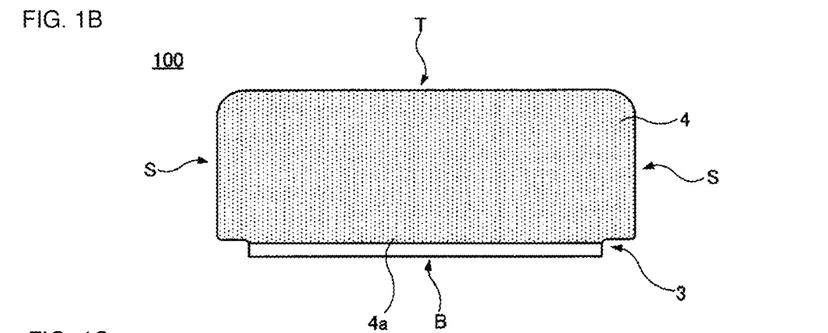
FIG. 1B is a side view of the laminated electronic component 100.
Figure 1C:
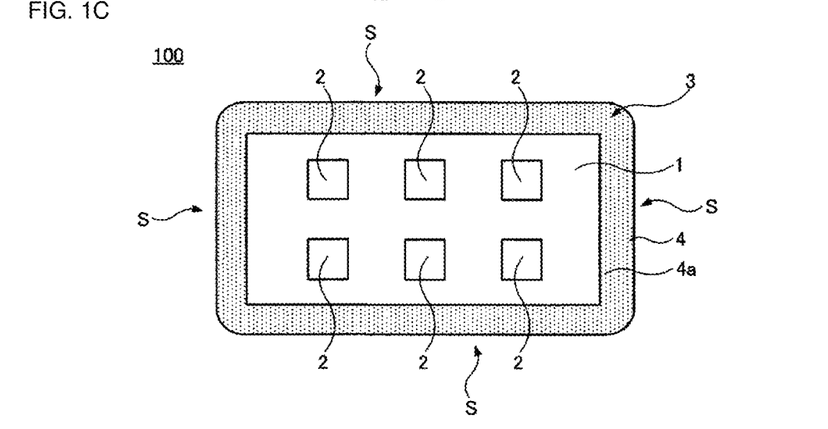
FIG. 1C is a bottom view of the laminated electronic component 100.
Figure 2A:
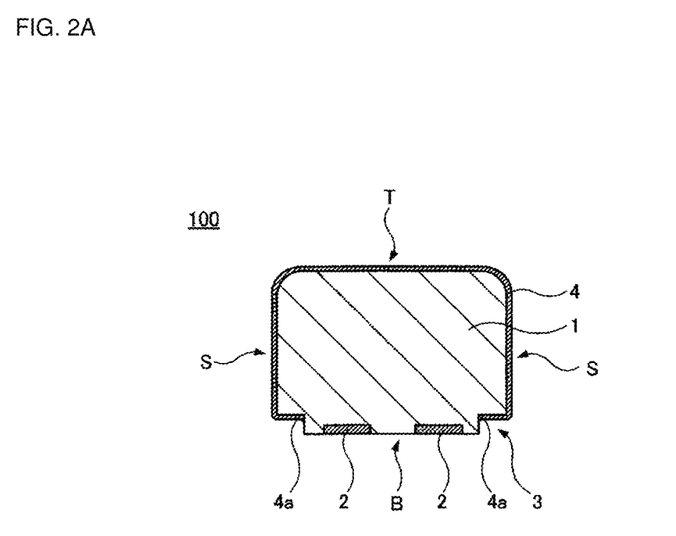
FIG. 2A is a cross section of the laminated electronic component 100 as viewed from the front side thereof.
Figure 2B:
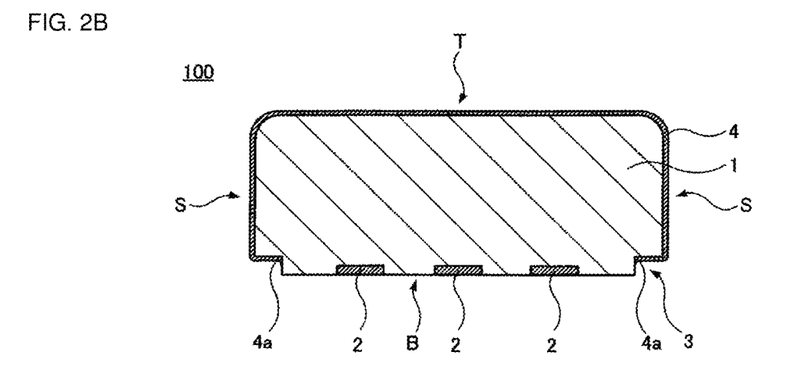
FIG. 2B is a cross section of the laminated electronic component 100 as viewed laterally.

FIGS. 1A to 1C and FIGS. 2A and 2B are views illustrating a laminated electronic component 100 according to the first preferred embodiment of the present invention. FIG. 1A is a front view of the laminated electronic component 100, FIG. 1B is a side view thereof, and FIG. 1C is a bottom view thereof. In addition, FIG. 2A is a cross section of the laminated electronic component 100 as viewed from the front side thereof, and FIG. 2B is another cross section as viewed laterally.

The laminated electronic component 100 is preferably, for example, a multilayer LC filter in which capacitors and inductors are provided so as to define a predetermined filter circuit. However, the laminated electronic component 100 may be any other type of device and is not limited to the multilayer LC filter.

The laminated electronic component 100 includes a multilayer body 1 that is made of insulators, such as ceramic insulators, for example.

The multilayer body 1 has a cuboid including a top surface T, a bottom surface B, and four side surfaces S. The multilayer body 1 includes rounded edges at which adjacent surfaces are connected to each other.

The multilayer body 1 includes multiple insulator layers made of ceramics, of which illustration is omitted. Via conductors are provided at predetermined positions so as to penetrate a predetermined insulator layer between two main surfaces thereof. In addition, conductor patterns, each having a predetermined shape, are formed at predetermined positions between predetermined insulator layers. The conductor patterns may be grouped into capacitor conductor patterns, inductor conductor patterns, ground conductor patterns, and the like. For example, capacitors are provided to have capacitance generated between pairs of capacitor conductor patterns. For example, inductors are provided by connecting multiple inductor conductor patterns to each other by the via conductors.

The laminated electronic component 100 defines a predetermined filter circuit by connecting capacitors and inductors provided inside the multilayer body 1.

The via conductors and the conductor patterns are made of a metal having a main ingredient, such as silver and copper, for example.

Multiple terminal electrodes 2 are provided at the bottom surface B of the multilayer body 1. The terminal electrodes 2 are connected to predetermined portions of the filter circuit provided inside the multilayer body 1. However, the terminal electrodes 2 may include "dummy" electrodes that are not connected to the filter circuit.

The terminal electrodes 2 are also made of a metal having a main ingredient, such as silver and copper, for example. A plating layer (not illustrated) is provided on the surfaces of the terminal electrode 2. For example, the plating layer preferably includes a first layer made of nickel and a second layer made of a metal selected from the group consisting of gold, copper, and tin. However, the plating layer may have a single layer structure instead of the multilayer structure. In addition, the material of the plating layer is not specifically limited and may be any other suitable metal.

Step differences 3 are provided in a rectangular or substantially rectangular and annular shape along the ridges of the multilayer body 1 at which respective side surfaces S are connected to the bottom surface B. Each step difference 3 is structured so as to include two surfaces such that one surface is parallel or substantially parallel to the bottom surface B and the other surface is parallel or substantially parallel to a corresponding side surface S.

A shield film 4 is provided on the top surface T and four side surfaces S of the multilayer body 1. The shield film 4 reduces or prevents outside noise from entering the inside of the laminated electronic component 100 and also reduces or prevents noise from leaking out of the laminated electronic component 100. The structure and material of the shield film 4 is not specifically limited although in the present preferred embodiment, the shield film 4 preferably has a multilayer structure formed by repeating sputtering multiple times. For example, the shield film 4 may have a two-layer structure including a first layer made of copper and a second layer made of a stainless steel (SUS). Alternatively, the shield film 4 may have a two-layer structure including a first layer made of copper and a second layer made of nickel. Alternatively, the shield film 4 may have a three-layer structure including a first layer made of a stainless steel, a second layer made of copper, and a third layer made of a stainless steel. Alternatively, the shield film 4 may have a three-layer structure including a first layer made of copper, a second layer made of nickel, and a third layer made of a stainless steel. Alternatively, the shield film 4 may have a three-layer structure including a first layer made of nickel, a second layer made of copper, and a third layer made of a stainless steel. Alternatively, the shield film 4 may have a three-layer structure including a first layer made of a stainless steel, a second layer made of copper, and a third layer made of nickel. In addition, a plating layer (not illustrated) is preferably provided on the surface of the shield film 4. For example, the plating layer may preferably include a first layer made of nickel and a second layer made of a metal selected from the group consisting of gold, copper, and tin. The plating layer, however, may have a single layer structure instead of the multilayer structure. The material of the plating layer is not specifically limited and may be made of other metals.

Note that the shield film 4 is preferably connected to ground via at least one terminal electrode 2.

Edges 4a of the shield film 4 are disposed inside respective step differences 3.

In the laminated electronic component 100, the edges 4a of the shield film 4 are disposed inside the step difference 3 and, accordingly, the shield film 4 does not peel off easily from the multilayer body 1. In other words, in the laminated electronic component 100, the edges 4a of the shield film 4 from which detachment tends to start are disposed inside the step differences 3 and are thus protected. Accordingly, other objects (for example, other laminated electronic components 100) do not hit the edges 4a easily, which makes it difficult for the shield film 4 to peel off from the multilayer body 1.

In addition, in the laminated electronic component 100, the multilayer body 1 includes rounded edges at which adjacent surfaces are connected. Accordingly, in the laminated electronic component 100, when an object (such as another laminated electronic component 100) hits a ridge portion of the multilayer body 1, the ridge portion of the multilayer body 1 does not produce cracks or chipping easily. In addition, in the laminated electronic component 100, when the ridge portion of the multilayer body 1 hits an object (such as another laminated electronic component 100), an impact on the object is small.

The laminated electronic component 100 may be manufactured, for example, by a method described as follows. The method will be described with reference to FIGS. 3A to 5H and FIG. 6.

Figure 3A:
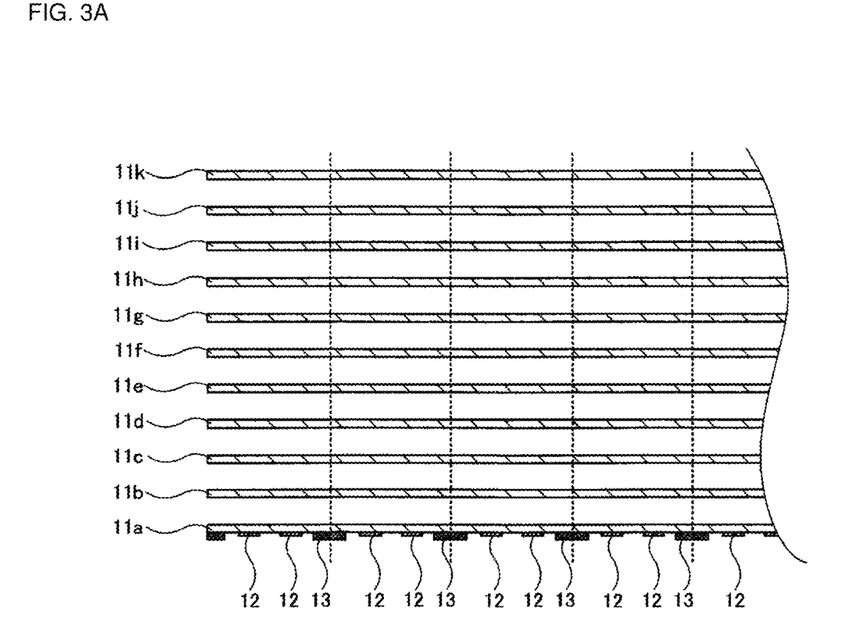
FIGS. 3A and 3B are cross-sectional views depicting steps performed in a non-limiting example of a method of manufacturing the laminated electronic component 100.

First, as illustrated in FIG. 3A, multiple mother green sheets 11a to 11k are prepared for manufacturing of the multilayer body 1. The mother green sheets 11a to 11k are prepared so as to manufacture a number of laminated electronic components 100 together. The mother green sheets 11a to 11k include the same number of individual green sheets that are arranged in a matrix on each of the mother green sheets 11a to 11k.

Figure 6:
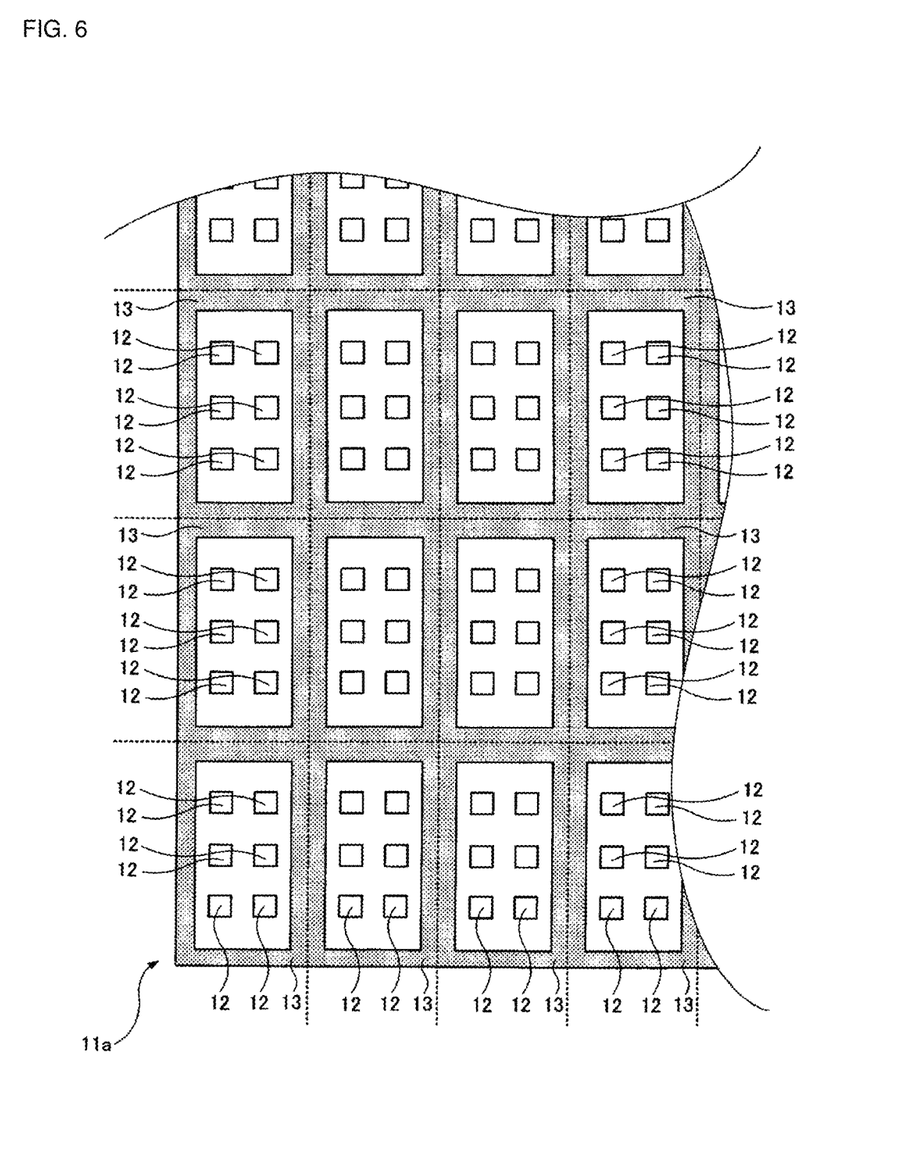
FIG. 6 is a bottom view (a view illustrating the bottom main surface) of a mother green sheet 11a illustrated in FIG. 3A.

As illustrated in FIGS. 3A and 6 (which is the bottom view of the mother green sheet 11a), conductive paste 12 for forming terminal electrodes 2 is applied in a predetermined shape in advance at predetermined positions on the bottom main surface of each individual green sheet of the mother green sheet 11a that is laminated as the bottommost layer.

Resin paste 13 for forming the step differences 3 is applied in advance rectangularly or substantially rectangularly and annularly on the bottom main surface of each individual green sheet of the mother green sheet 11a that is laminated as the bottommost layer, such that the resin paste 13 surrounds all of the bumps of the conductive paste 12 already applied on the green sheet. As a result, the resin paste 13 is applied along the peripheral edges of each green sheet so as to partition adjacent green sheets that are arranged side by side in the lengthwise and widthwise directions on the bottom main surface of the mother green sheet 11a. Note that in this stage, the resin paste 13 applied on each individual green sheet extends to the resin paste 13 applied on adjacent green sheets.

In each individual green sheet of the mother green sheets 11a to 11j, holes (not illustrated) for forming the via conductors are pierced in advance at predetermined positions as necessary between both main surfaces of the individual green sheet, and the holes are filled with conductive paste. In each individual green sheet of the mother green sheets 11a to 11j, conductive paste for forming conductor patterns (not illustrated) is applied in a predetermined shape in advance as necessary on the main surface at predetermined positions.

Each individual green sheet of the mother green sheet 11k to be laminated as the topmost layer becomes a protection layer. Accordingly, no holes are formed and no conductive paste is applied.

Figure 3B:
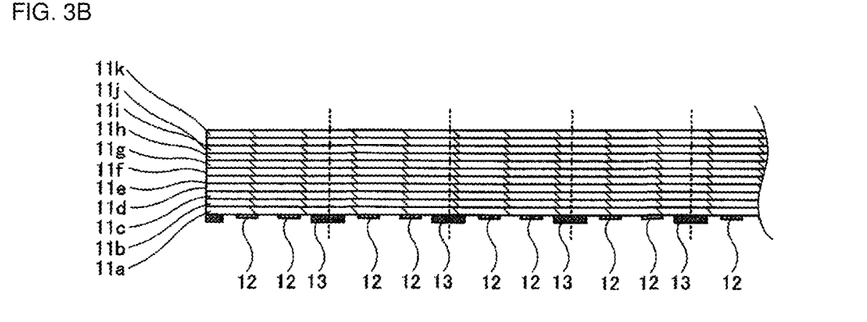

Next, as illustrated in FIG. 3B, the mother green sheets 11a to 11k are stacked on each other.

Figure 4C:
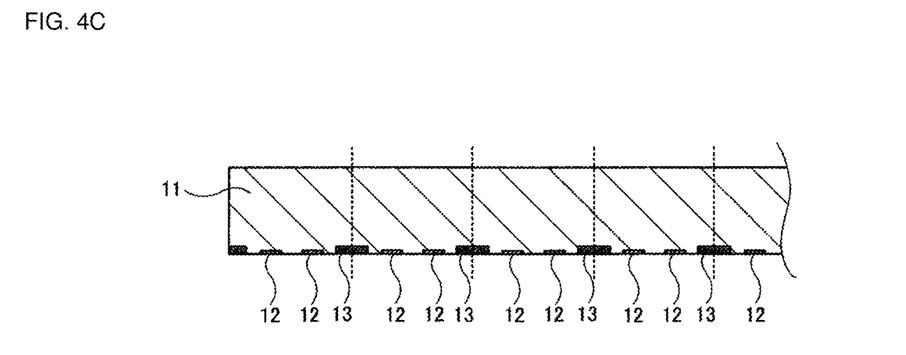
FIGS. 4C to 4E are cross-sectional views depicting steps performed successively after the step in FIG. 3B in the non-limiting example of a method of manufacturing the laminated electronic component 100.

Subsequently, as illustrated in FIG. 4C, an unsintered mother multilayer body 11 is produced by pressing the mother green sheets 11a to 11k in the vertical direction into one body. As a result, both of the conductive paste 12 and the resin paste 13 applied on the bottom main surface of the mother green sheet 11a are pushed into the bottom surface of the unsintered mother multilayer body 11.

Figure 4D:
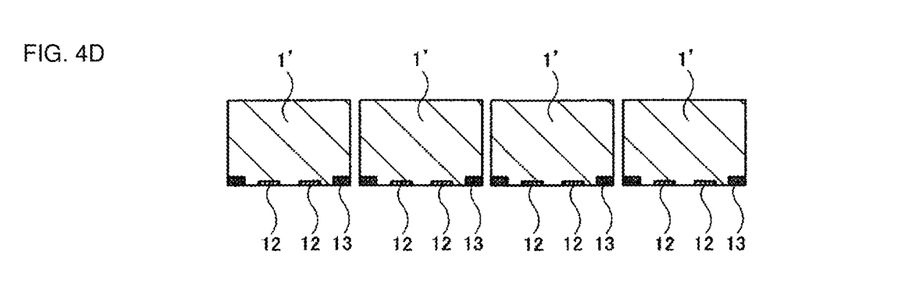

Next, as illustrated in FIG. 4D, the unsintered mother multilayer body 11 is separated into individual unsintered multilayer bodies 1'. The separation is performed, for example, by using a dicer.

Figure 4E:
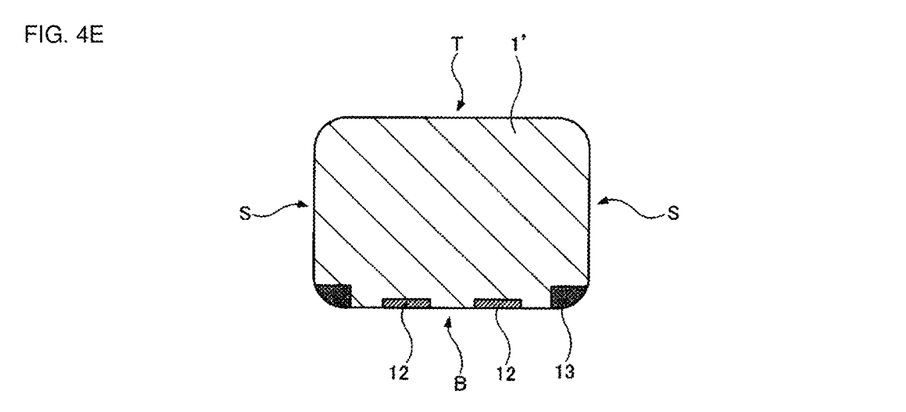

Next, as illustrated in FIG. 4E, the unsintered multilayer body 1' is polished by barrel polishing. As a result, the multilayer body 1 is rounded so as to include rounded edges at which that adjacent surfaces are connected. Note that the edges where the resin paste 13 has been pushed into the bottom surface of each unsintered multilayer body 1' are also rounded. Note that the scale used in FIG. 4E is different from that used in FIGS. 3A to 4D.

Figure 5F:
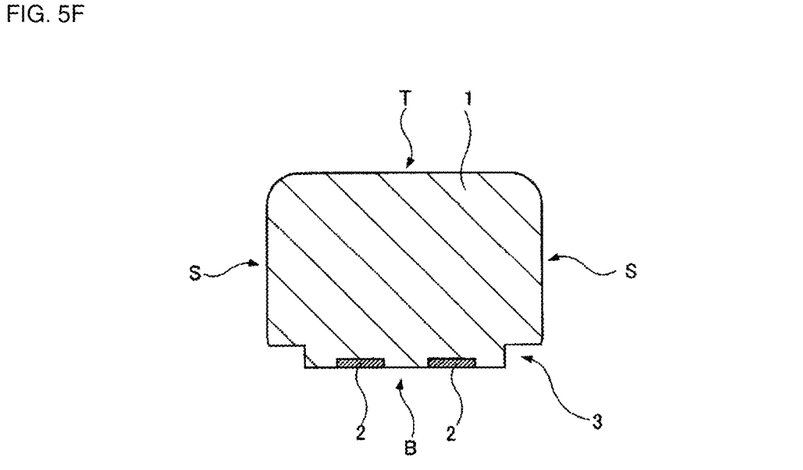
FIGS. 5F to 5H are cross-sectional views depicting steps performed successively after the step in FIG. 4E in the non-limiting example of a method of manufacturing the laminated electronic component 100.

Next, as illustrated in FIG. 5F, the multilayer body 1 is produced by firing the unsintered multilayer body 1' in accordance with a predetermined firing profile. As a result, the conductive paste (not illustrated) that has been filled in the holes pierced between both main surfaces of each of the mother green sheets 11a to 11j is fired simultaneously, and the conductive paste (not illustrated) that has been applied as conductor patterns onto the main surface of each of the mother green sheet 11a to 11j is also fired simultaneously. Thus, the via conductors and the conductor patterns are formed inside the multilayer body 1. In addition, the conductive paste 12 that has been pushed into the bottom surface of the unsintered multilayer body 1' is also fired simultaneously. Thus, the terminal electrodes 2 are formed on the bottom surface B of the multilayer body 1. Moreover, the resin paste 13 that has been pushed into the bottom surface of the unsintered multilayer body 1' is burnt off. Thus, the step differences 3 are formed along the ridges at which respective side surfaces S and the bottom surface B of the multilayer body 1 are connected. As described above, the step differences 3 are formed into a rectangular or substantially rectangular and annular shape.

Figure 5G:
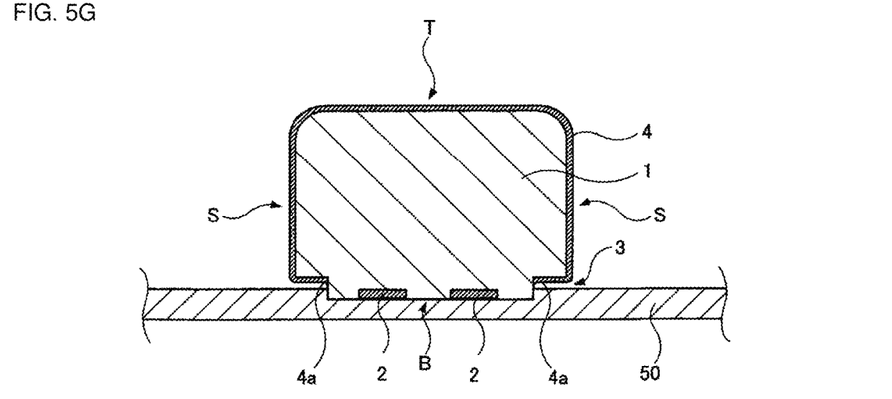

Next, as illustrated in FIG. 5G, the bottom surface B of the multilayer body 1 is fixed to a fixing jig 50 including a cohesive surface, and sputtering is performed on the surfaces of the multilayer body 1. Thus, the shield film 4 is formed on the top surface T and the four side surfaces S of the multilayer body 1. Here, providing a gap between the surface of the fixing jig 50 and each step difference 3 allows each edge 4a of the shield film 4 to be formed inside the step difference 3.

Figure 5H:
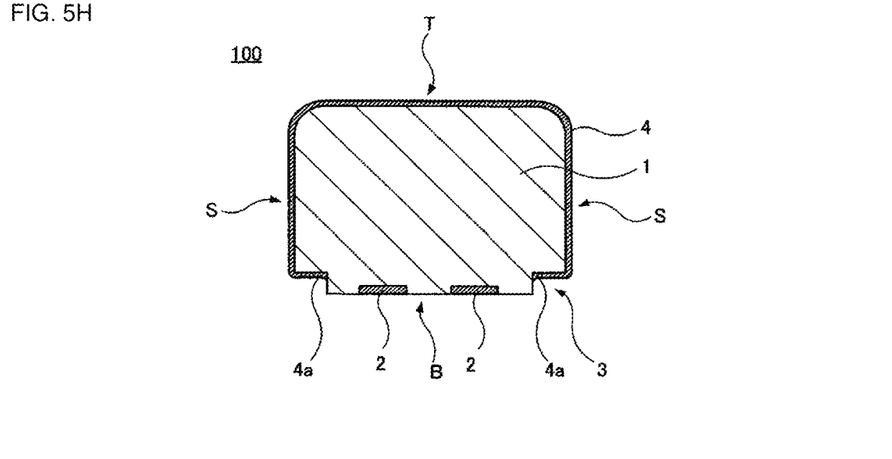

Finally, after the multilayer body 1 is removed from the fixing jig 50, as illustrated in FIG. 5H, a plating layer is formed on the surface of each terminal electrode 2 and on the surface of the shield film 4, for example, by electrolytic plating. Thus, the laminated electronic component 100 is manufactured.

In the above manufacturing method, a plating layer is formed on the surface of each terminal electrode 2 and on the surface of the shield film 4, for example, by electrolytic plating after the shield film 4 is formed on the multilayer body 1 by sputtering as illustrated in FIG. 5G. However, these two steps may be switched. In other words, the plating layer may be formed first on the surfaces of the terminal electrodes 2, for example, by electrolytic plating, and subsequently, the shield film 4 may be formed on the surfaces of the multilayer body 1 by sputtering. In this case, the plating layer is not formed over the surface of the shield film 4. However, a plating layer may be formed on the surface of the shield film 4, if necessary, by adding such a step.

Second Preferred Embodiment

Figure 7A:
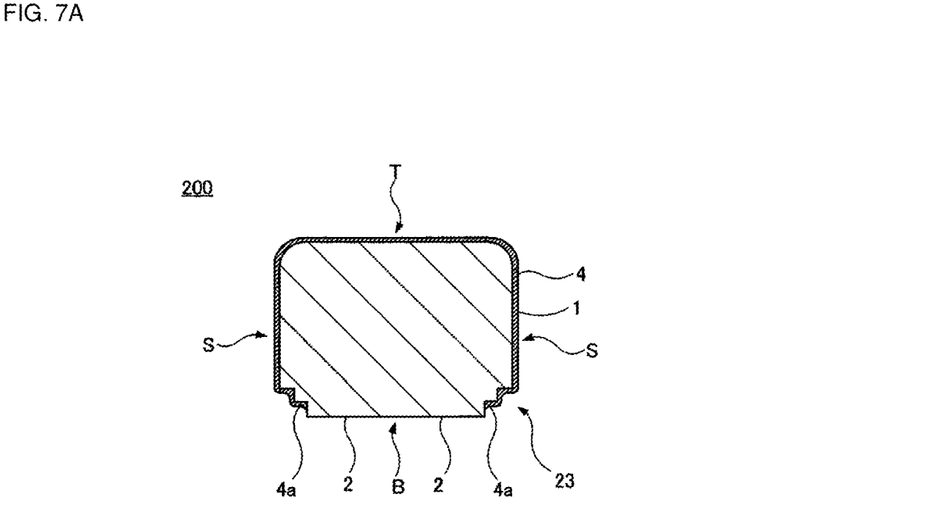
FIG. 7A is a cross section of a laminated electronic component 200 according to a second preferred embodiment of the present invention as viewed from the front side thereof.
Figure 7B:
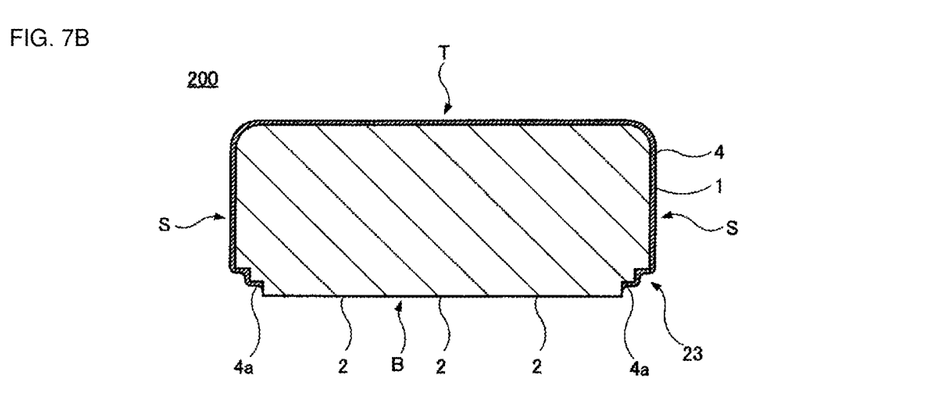
FIG. 7B is a cross section of the laminated electronic component 200 as viewed laterally.

FIGS. 7A and 7B illustrate a laminated electronic component 200 according to the second preferred embodiment of the present invention. FIG. 7A is a cross section of the laminated electronic component 200 as viewed from the front side thereof, and FIG. 7B is another cross section as viewed laterally.

The laminated electronic component 200 has a configuration partially different from that of the laminated electronic component 100 according to the first preferred embodiment. More specifically, the laminated electronic component 200 has step differences 23 that are provided stepwise, unlike the laminated electronic component 100 in which the step differences 3 are each provided so as to include two surfaces with one surface being parallel or substantially parallel to the bottom surface B and the other surface being parallel or substantially parallel to a corresponding side surface S. In other words, each step difference 23 includes a surface parallel or substantially parallel to the bottom surface B and a surface parallel or substantially parallel to a corresponding side surface S and also includes another surface parallel or substantially parallel to the bottom surface B and another surface parallel or substantially parallel to the side surface S, of which the surfaces are connected to each other in this order. Note that the step differences 23 have a rectangular or substantially rectangular and annular shape along the ridges at which respective side surfaces S and the bottom surface B of the multilayer body 1 are connected, which is the same or substantially the same as the laminated electronic component 100.

As described in the method of manufacturing the laminated electronic component 100, the resin paste 13 is applied rectangularly or substantially rectangularly and annularly on each of the green sheets of the mother green sheet 11a laminated as the bottommost layer. In the laminated electronic component 200, the resin paste 13 preferably has a stepwise shape, for example, by applying the resin paste 13 twice, which enables the step differences 23 have the stepwise shape.

In the case of the laminated electronic component 200, objects (for example, other laminated electronic components 200) do not easily hit the edges 4a of the shield film 4 from which detachment tends to start, which makes it difficult for the shield film 4 to peel off from the multilayer body 1.

Third Preferred Embodiment

Figure 8A:
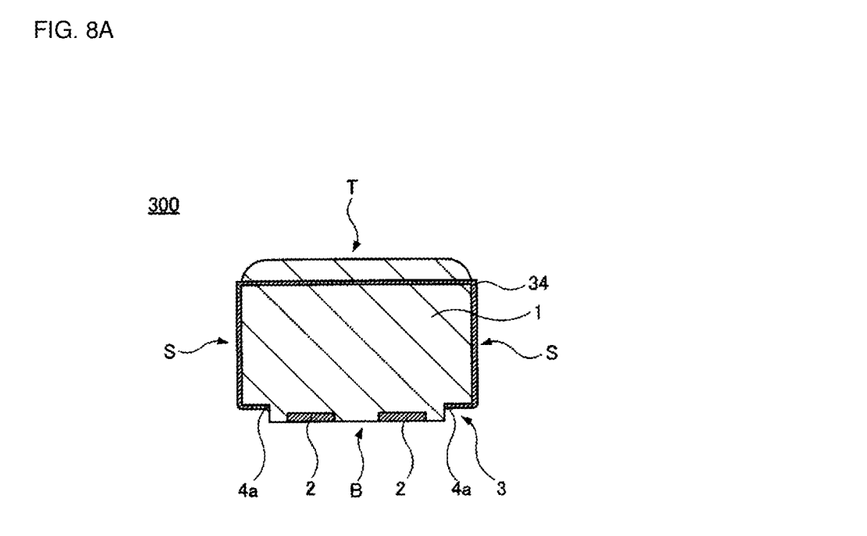
FIG. 8A is a cross section of a laminated electronic component 300 according to a third preferred embodiment of the present invention as viewed from the front side thereof.
Figure 8B:
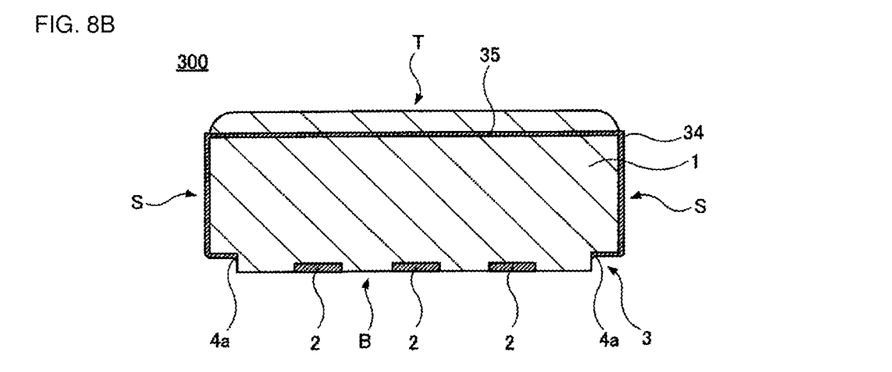
FIG. 8B is a cross section of the laminated electronic component 300 as viewed laterally.

FIGS. 8A and 8B illustrate a laminated electronic component 300 according to a third preferred embodiment of the present invention. FIG. 8A is a cross section of the laminated electronic component 300 as viewed from the front side thereof, and FIG. 8B is another cross section as viewed laterally.

The laminated electronic component 300 also has a configuration partially different from that of the laminated electronic component 100 according to the first preferred embodiment. More specifically, the laminated electronic component 100 includes the shield film 4 provided on the top surface T of the multilayer body 1 and also on the four side surfaces S thereof. However, in the laminated electronic component 300, a shield film 34 is provided only on the four side surfaces S of the multilayer body 1 and not on the top surface T thereof. In addition, in the laminated electronic component 300, an internal shield film 35 is provided between insulator layers of the multilayer body 1 located near the top surface T thereof. The internal shield film 35 is connected to the shield film 34.

The internal shield film 35 may be formed by applying a conductive paste for forming the internal shield film onto the main surface of a green sheet (mother green sheet) laminated near the top surface T when the unsintered mother multilayer body 11 is produced. To avoid formation of the shield film 34 on the top surface T, a mask may be formed on the top surface T before the shield film 34 is formed by sputtering.

The internal shield film 35 may preferably be utilized for circuit formation (filter circuit formation) in the laminated electronic component 300. For example, a capacitor conductor pattern may be provided between insulator layers located adjacent to the insulator layers between which the internal shield film 35 is provided. The capacitor conductor pattern and the internal shield film 35 generate capacitance, thus defining a capacitor (a shunt capacitor connected to ground, for example).

Note that the laminated electronic component 300 does not include the shield film 34 on the top surface T of the multilayer body 1. However, the shield film may be provided on the top surface T of the multilayer body 1 so that both the shield film 34 and the internal shield film 35 are provided.

The laminated electronic components 100, 200, and 300 according to the first, second, and third preferred embodiments have been described. However, the present invention is not limited to these preferred embodiments, and may be subjected to various modifications within the scope of the present invention.

For example, in each of the laminated electronic components 100, 200, and 300, the shield film 4 or 34 is provided on the entirety or substantially the entirety of the four side surfaces S of the multilayer body 1. However, the shield film 4 or 34 may be partially provided on each side surface S. Moreover, the shield film 4 or 34 need not be provided on all of the four surfaces S, and may be provided on at least one side surface S.

Furthermore, in each of the laminated electronic component 100, 200, and 300, the step differences 3 or 23 have an annular shape along the ridges at which respective side surfaces S and the bottom surface B of the multilayer body 1 are connected. However, the step differences 3 or 23 need not be continuously provided into an annular shape, and may be discontinuously provided.

Furthermore, the laminated electronic components 100, 200, and 300 are described as multilayer LC filters. However, the laminated electronic components are not limited to the multilayer LC filters, and may define various other types of laminated electronic components.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated electronic component comprising:
   a multilayer body including a plurality of insulator layers that are laminated, the multilayer body including a bottom surface, a top surface, and four side surfaces connecting the bottom surface and the top surface to each other; and
   a shield film provided on at least the four side surfaces of the multilayer body; wherein
   at least one step difference is provided along four ridges at which the bottom surface and the four side surfaces of the multilayer body are respectively connected to each other;
   the at least one step difference has a rectangular or substantially rectangular and annular shape along the four ridges at which the four side surfaces and the bottom surface are respectively connected to each other; and
   the shield film includes an edge portion disposed within the at least one step difference.

2. The laminated electronic component according to claim 1, wherein the multilayer body includes an internal shield film disposed between adjacent ones of the plurality of insulator layers at or adjacent to the top surface.

3. The laminated electronic component according to claim 1, wherein the shield film is provided over an entirety or substantially an entirety of the four side surfaces.

4. The laminated electronic component according to claim 1, wherein each of the at least one step differences includes one surface parallel or substantially parallel to a corresponding one of the four side surfaces and another surface parallel or substantially parallel to the bottom surface.

5. The laminated electronic component according to claim 1, wherein each of the at least one step difference has a stepwise shape.

6. The laminated electronic component according to claim 1, wherein the shield film is also provided on the top surface.

7. A laminated electronic component, comprising:
a multilayer body including a plurality of insulator layers that are laminated, the multilayer body including a bottom surface, a top surface, and a plurality of side surfaces connecting the bottom surface and the top surface to each other; and
a shield film provided on at least one of the side surfaces of the multilayer body; wherein
the multilayer body includes rounded edges that connect adjacent ones of the top surface, the plurality of side surfaces and the bottom surface;
at least one step difference is provided along a ridge at which the bottom surface and the at least one of the side surfaces of the multilayer body are connected to each other; and
the shield film includes an edge portion disposed within the at least one step difference.

8. The laminated electronic component according to claim 7, wherein each of the at least one step differences includes one surface parallel or substantially parallel to a corresponding one of the side surfaces and another surface parallel or substantially parallel to the bottom surface.

9. The laminated electronic component according to claim 7, wherein each of the at least one step difference has a stepwise shape.

10. The laminated electronic component according to claim 7, wherein the multilayer body includes an internal shield film disposed between adjacent ones of the plurality of insulator layers at or adjacent to the top surface.

11. A method of manufacturing a laminated electronic component, the method sequentially comprising:
a step of providing an unsintered multilayer body including a bottom surface, a top surface, and a plurality of side surfaces that connect the bottom surface and the top surface to each other and in which a plurality of ceramic green sheets are laminated and resin paste is applied on the bottom surface along peripheral edges thereof;
a step of pushing the resin paste into the bottom surface;
a step of firing the unsintered multilayer body to form a multilayer body in which at least one step difference is formed along a ridge at which the bottom surface and a corresponding one of the side surfaces are connected to each other; and
a step of forming a shield film on the corresponding one of the side surfaces of the multilayer body, the shield film including an edge disposed within the at least one step difference.

12. The method of manufacturing the laminated electronic component according to claim 11, further comprising:
a step of rounding portions of the unsintered multilayer body, using barrel polishing, at which adjacent ones of the top surface, the plurality of side surfaces, and the bottom surface of the unsintered multilayer body are connected to each other, the step of rounding being performed between the step of pushing the resin paste into the bottom surface and the step of firing the unsintered multilayer body to form the multilayer body.

13. The method of manufacturing the laminated electronic component according to claim 11, wherein the resin paste applied on the bottom surface of the unsintered multilayer body along the peripheral edges thereof is applied in advance on a bottom main surface of one of the plurality of ceramic green sheets that is laminated as a bottommost layer of the unsintered multilayer body along peripheral edges of the bottom main surface.

14. The method of manufacturing the laminated electronic component according to claim 11, wherein the shield film is formed using sputtering.

15. The method of manufacturing the laminated electronic component according to claim 11, wherein
the unsintered multilayer body includes four side surfaces;
the resin paste is applied on the bottom surface of the unsintered multilayer body rectangularly or substantially rectangularly and annularly along peripheral edges thereof; and
the at least one step difference is formed into a rectangular or substantially rectangular and annular shape along four ridges of the multilayer body at which the four side surfaces and the bottom surface are respectively connected to each other.

16. A laminated electronic component, comprising:
a multilayer body including a plurality of insulator layers that are laminated, the multilayer body including a bottom surface, a top surface, and a plurality of side surfaces connecting the bottom surface and the top surface to each other; and
a shield film provided on at least one of the side surfaces of the multilayer body; wherein
at least one step difference is provided along a ridge at which the bottom surface and the at least one of the side surfaces of the multilayer body are connected to each other; and
the shield film includes an edge portion disposed within the at least one step difference; and
the shield film is provided over an entirety or substantially an entirety of the top surface.

17. The laminated electronic component according to claim 16, wherein each of the at least one step differences includes one surface parallel or substantially parallel to a corresponding one of the side surfaces and another surface parallel or substantially parallel to the bottom surface.

18. The laminated electronic component according to claim 16, wherein each of the at least one step difference has a stepwise shape.

19. The laminated electronic component according to claim 16, wherein the multilayer body includes an internal shield film disposed between adjacent ones of the plurality of insulator layers at or adjacent to the top surface.

* * * * *